United States Patent
Bhatt et al.

(10) Patent No.: US 6,537,923 B1
(45) Date of Patent: Mar. 25, 2003

(54) PROCESS FOR FORMING INTEGRATED CIRCUIT STRUCTURE WITH LOW DIELECTRIC CONSTANT MATERIAL BETWEEN CLOSELY SPACED APART METAL LINES

(75) Inventors: Hemanshu D. Bhatt, Troutdale, OR (US); Shafqat Ahmed, Beaverton, OR (US); Robindranath Banerjee, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 184 days.

(21) Appl. No.: 09/704,200

(22) Filed: Oct. 31, 2000

(51) Int. Cl.$^7$ .................. H01L 21/31; H01L 31/469

(52) U.S. Cl. .................. 438/758; 438/695; 438/623; 438/479; 438/639; 438/740; 438/783

(58) Field of Search .................. 438/758, 624, 438/453, 618, 639, 622, 623, 631, 637, 692, 646, 656, 479, 669, 699, 702, 783, 740, 695

(56) References Cited

U.S. PATENT DOCUMENTS

| 3,012,861 A | 12/1961 | Ling | 23/223.5 |
| 3,178,392 A | 4/1965 | Kriner | 260/46.5 |

(List continued on next page.)

FOREIGN PATENT DOCUMENTS

| DE | 198 04 375 A1 | 7/1999 | H01L/21/312 |
| EP | 0 706 216 A2 | 4/1996 | H01L/23/532 |
| EP | 0 949 663 A2 | 10/1999 | H01L/21/312 |
| JP | 63003437 | 1/1988 | H01L/21/90 |
| JP | 2000-267128 | 9/2000 | G02F/1/136 |
| WO | WO 99/41423 | 8/1999 | |

OTHER PUBLICATIONS

McClatchie et al., Low K Oxide films deposited by CVD, 1998 Proceedings on DUMIC, pp. 311–318.*

(List continued on next page.)

*Primary Examiner*—Matthew Smith
*Assistant Examiner*—Igwe U. Anya
(74) *Attorney, Agent, or Firm*—John P. Taylor

(57) ABSTRACT

A capping layer of an insulator such as silicon nitride is formed over horizontally closely spaced apart metal lines on an oxide layer of an integrated circuit structure formed on a semiconductor substrate. Low k silicon oxide dielectric material which exhibits void-free deposition properties in high aspect ratio regions between the closely spaced apart metal lines is then deposited over and between the metal lines and over the silicon nitride caps on the metal lines. After the formation of such low k silicon oxide dielectric material between the closely spaced apart metal lines and the over silicon nitride caps thereon, a second layer of silicon nitride is deposited over the layer of low k silicon oxide dielectric material. This second silicon nitride layer acts as a protective layer over portions of the layer of low k silicon oxide dielectric material between the metal lines which may be lower that the top surface of the silicon nitride caps on the metal lines to prevent further etching or dishing of those portions of the layer of low k silicon oxide dielectric material during the planarizing step. The structure is then planarized to bring the level of the low k silicon oxide dielectric material down to the level of the tops of the silicon nitride caps on the metal lines. A further layer of standard k silicon oxide dielectric material is then formed over the planarized void-free low k silicon oxide dielectric layer and the silicon nitride caps. Vias are then formed through the standard k silicon oxide dielectric layer and the silicon nitride caps down to the metal lines. Since the vias are not formed through the low k silicon oxide dielectric material, formation of the vias does not contribute to poisoning of the vias. However, the presence of the low k silicon oxide dielectric material between the horizontally closely spaced apart metal lines reduces the horizontal capacitance between such metal lines.

17 Claims, 5 Drawing Sheets

U.S. PATENT DOCUMENTS

| | | | |
|---|---|---|---|
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,563,099 A * | 10/1996 | Grass | 438/632 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,759,906 A * | 6/1998 | Lou | 438/623 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/767 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,930,655 A | 7/1999 | Cooney, III | |
| 5,939,763 A | 8/1999 | Hao et al. | 257/411 |
| 5,989,998 A | 11/1999 | Sugahara et al. | |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,145 A | 3/2000 | Suzuki et al. | |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,054,379 A | 4/2000 | Yau | |
| 6,063,702 A | 5/2000 | Chung | |
| 6,066,574 A | 5/2000 | You et al. | 438/781 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,215,087 B1 | 4/2001 | Akahori et al. | |
| 6,232,658 B1 | 5/2001 | Catabay et al. | 257/701 |
| 6,247,998 B1 | 6/2001 | Wiswesser et al. | |
| 6,271,141 B2 * | 8/2001 | Juengling et al. | 438/695 |
| 6,380,066 B1 * | 4/2002 | See et al. | 438/624 |

OTHER PUBLICATIONS

Koda, Seiichiro, et al., "A Study of Inhibition Effects for Silane Combustion by Additive Gases", *Combustion and Flame*, vol. 73, No. 2, Aug., 1988, pp. 187–194.

Bothra, S., et al., "Integration of 0.25 $\mu$m Three and Five Level Interconnect System for High Performance ASIC", *1997 Proceedings Fourteenth International VMIC Conference*, Santa Clara, CA, Jun. 10–12, 1997, 99. 46–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

\* cited by examiner

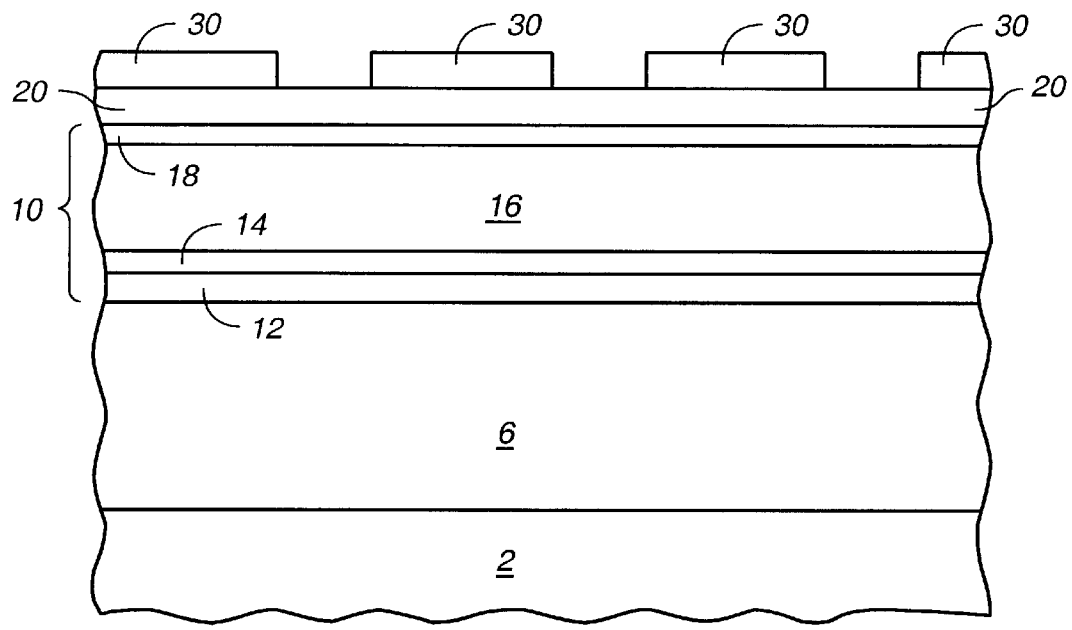
FIG._1
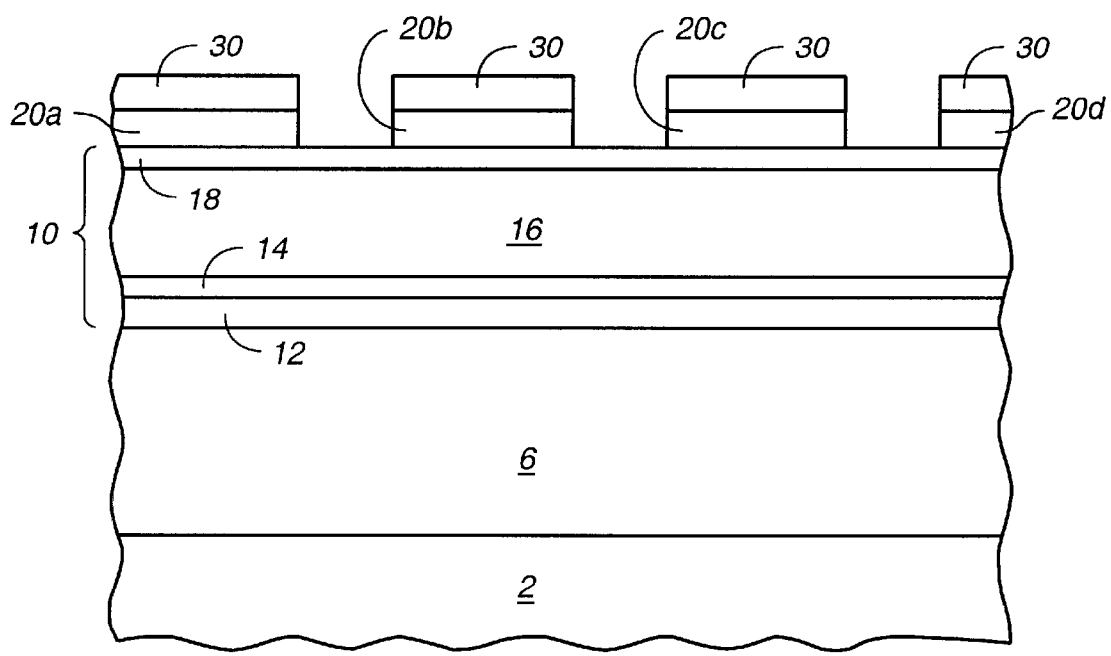
FIG._2

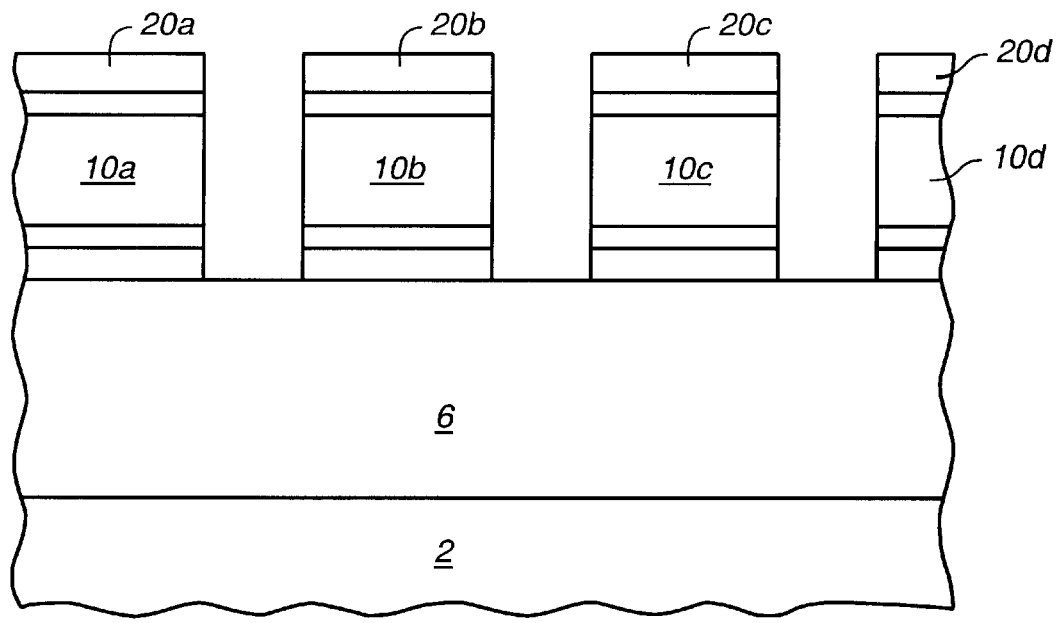
FIG._3
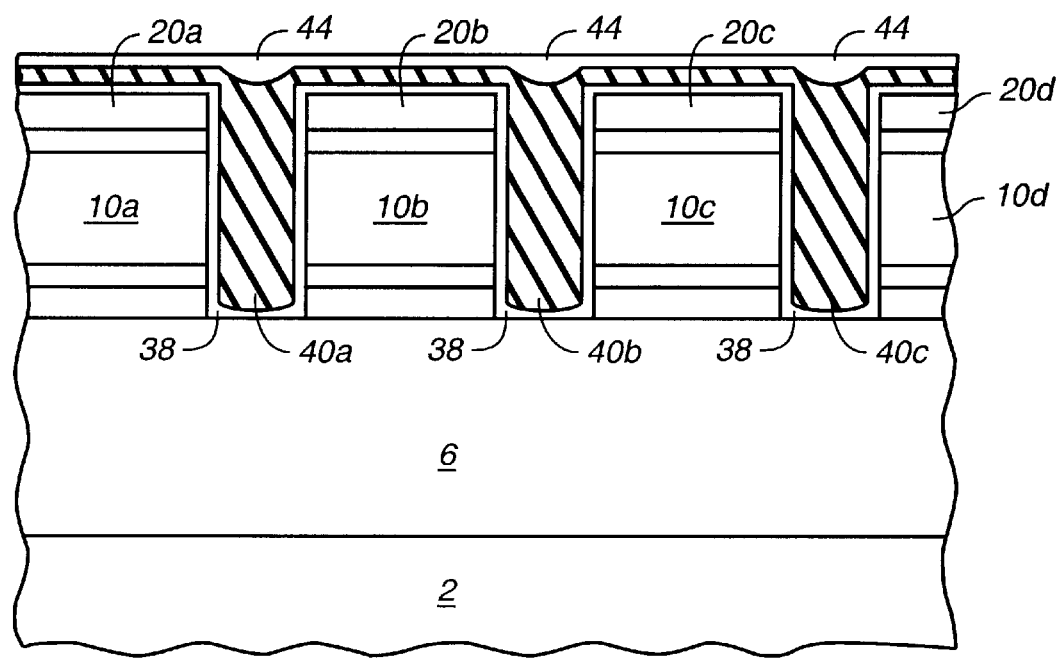
FIG._4

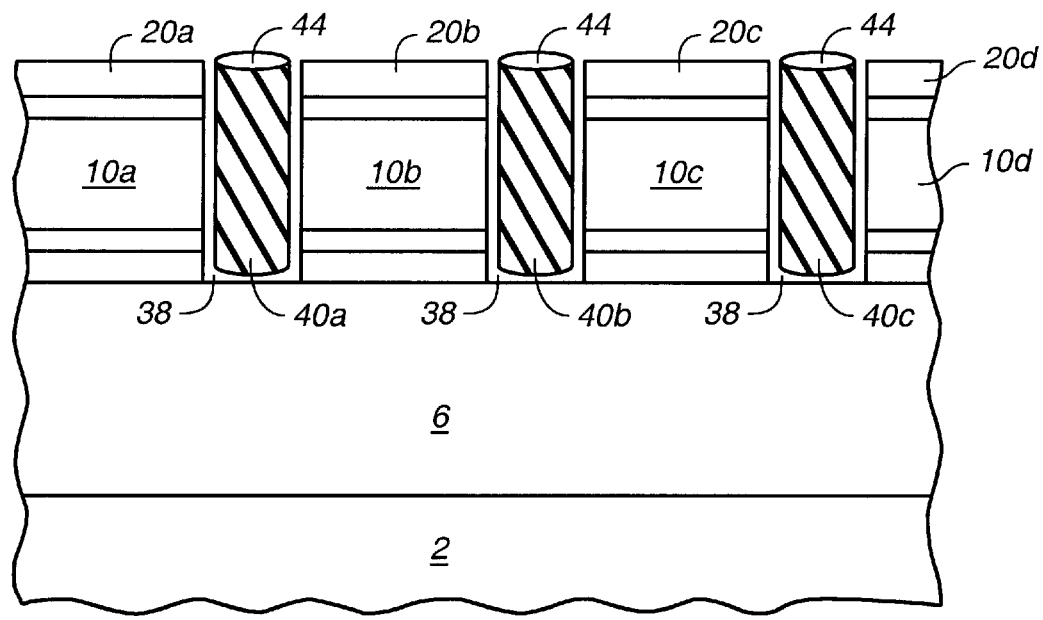
FIG._5
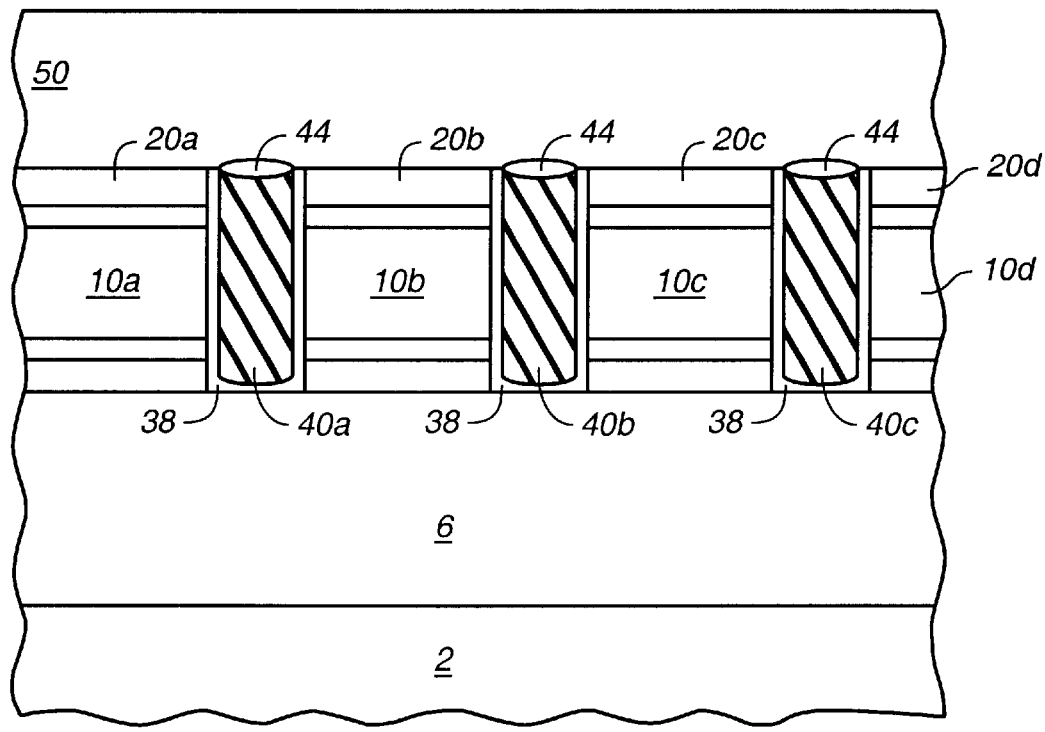
FIG._6

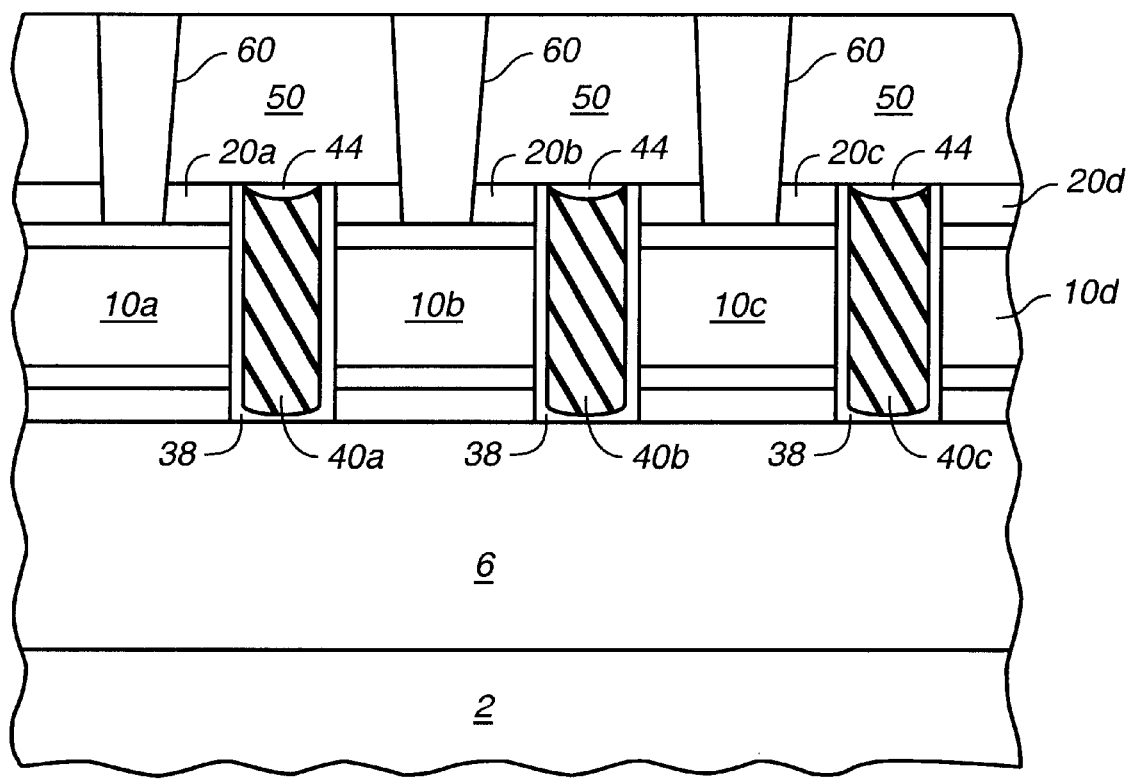
FIG._7

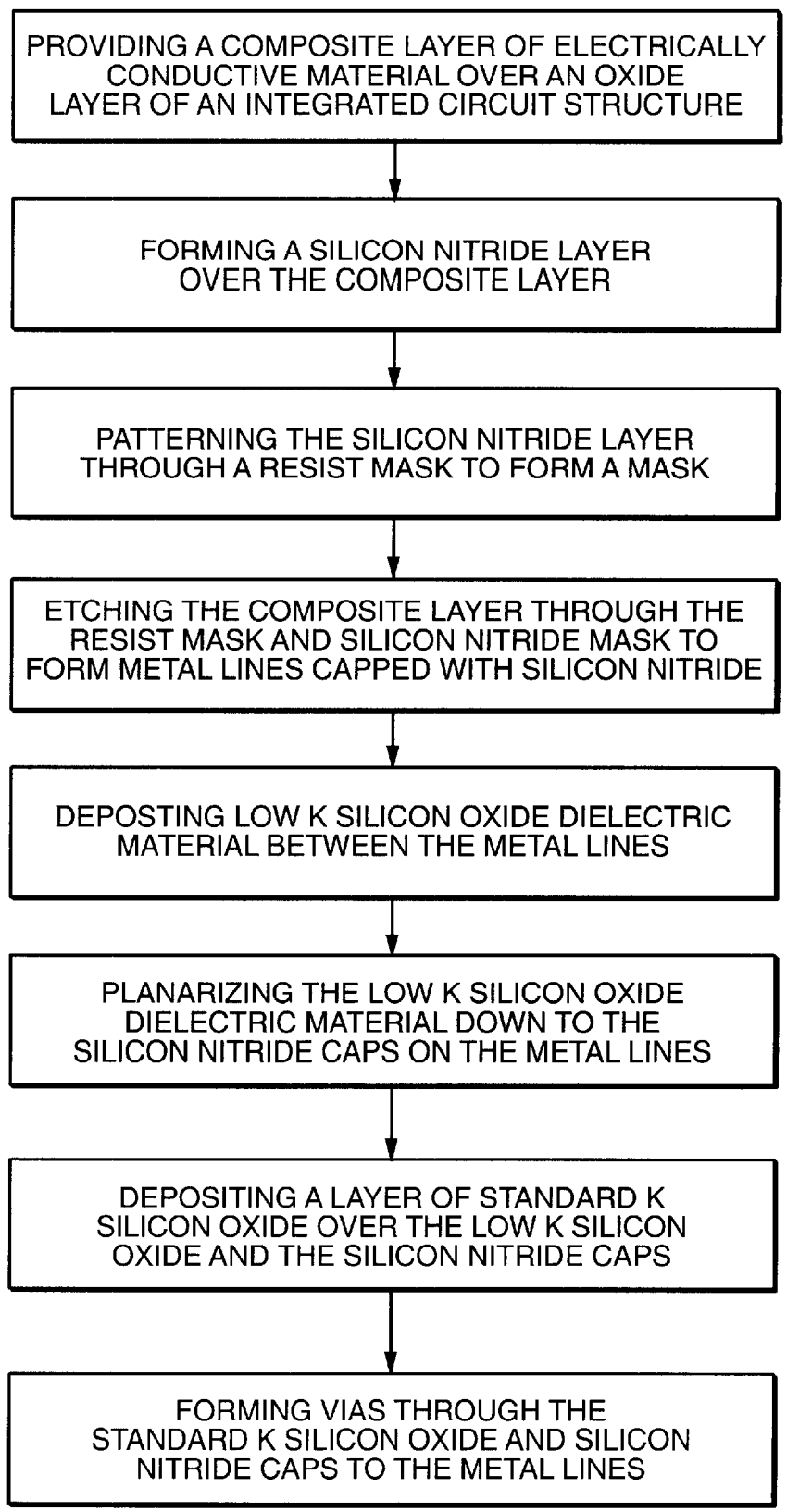
FIG._8

PROCESS FOR FORMING INTEGRATED CIRCUIT STRUCTURE WITH LOW DIELECTRIC CONSTANT MATERIAL BETWEEN CLOSELY SPACED APART METAL LINES

CROSS REFERENCE TO RELATED APPLICATIONS

The subject matter of this application relates to the subject matter of U.S. Pat. No. 6,417,093, issued Jul. 9, 2002, entitled "PROCESS FOR PLANARIZATION OF METAL-FILLED TRENCHES OF INTEGRATED CIRCUIT STRUCTURES", assigned to the assignee of this application, and filed on the same date as this application.

The subject matter of this application relates to the subject matter of U.S. Pat. No. 6,391,768, issued May 21, 2002, entitled "PROCESS FOR CMP REMOVAL OF EXCESS TRENCH OR VIA FILLER METAL WHICH INHIBITS FORMATION OF CONCAVE REGIONS ON OXIDE SURFACE OF INTEGRATED CIRCUIT STRUCTURE", assigned to the assignee of this application and, and filed on Oct. 31, 2000.

The subject matter of this application relates to the subject matter of U.S. Pat. No. 6,423,630, issued Jul. 23, 2002, entitled "PROCESS FOR FORMING LOW K DIELECTRIC MATERIAL BETWEEN METAL LINES", assigned to the assignee of this application, and filed on Oct. 31, 2000.

The subject matter of this application relates to the subject matter of U.S. Pat. No. 6,423,628, issued Jul. 30, 2002, entitled "INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES", assigned to the assignee of this application, and filed on Oct. 22, 1999.

The subject matter of this application relates to the subject matter of copending U.S. Patent Application Ser. No. 09/605,380, entitled "COMPOSITE LOW DIELECTRIC CONSTANT FILM FOR INTEGRATED CIRCUIT STRUCTURE", assigned to the assignee of this application, and filed on Jun. 27, 2,000.

BACKGROUND OF THE INVENTION

1. Field of the Invention

This invention relates to integrated circuit structures with reduced capacitance. More particularly, this invention relates to the formation of an integrated circuit structure with a layer of low dielectric constant dielectric material formed between horizontally closely spaced apart metal lines of an integrated circuit structure to reduce horizontal capacitance between closely spaced apart metal lines, while via poisoning in vias formed through a second layer of standard k dielectric material down to the metal lines is mitigated due to the presence of silicon nitride caps on the metal lines.

2. Description of the Related Art

In the continuing reduction of scale in integrated circuit structures, both the width of metal interconnects or lines and the horizontal spacing between such metal lines on any particular level of such interconnects have become smaller and smaller. As a result, horizontal capacitance has increased between such conductive elements. This increase in capacitance, together with the vertical capacitance which exists between metal lines on different layers, results in loss of speed and increased cross-talk. As a result, reduction of such capacitance, particularly horizontal capacitance, has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a chemical vapor deposition (CVD) process developed by Trikon Technologies of Newport, Gwent, U.K. The Trikon process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Trikon process.

The use of this type of low k material has been found to result in the formation of void-free filling of the high aspect ratio space between parallel closely spaced apart metal lines with dielectric material having a lower dielectric constant than that of convention silicon oxide, thereby resulting in a substantial lowering of the horizontal capacitance between such adjacent metal lines on the same metal wiring level.

However, the substitution of such low k dielectric materials for conventional silicon oxide insulation has not been without its own problems. It has been found that the subsequent formation of vias, or contact openings, through such low k dielectric material to the underlying conductive portions (such as metal lines, or contacts on an active device), can contribute to a phenomena known as via poisoning wherein filler material subsequently deposited in the via, such as a titanium nitride liner and tungsten filler material, fails to adhere to the via surfaces, resulting in unfilled vias. Apparently the presence of carbon in the low k dielectric material formed by the Trikon process renders the material more susceptible to damage during subsequent processing of the structure. For example, contact openings or vias are usually etched in the low k dielectric layer through a resist mask. When the resist mask is subsequently removed by an ashing process, damage can occur to the newly formed via surfaces of the low k material resulting in such via poisoning.

Copending U.S. patent application Ser. No. 09/426,061, entitled "LOW DIELECTRIC CONSTANT SILICON OXIDE-BASED DIELECTRIC LAYER FOR INTEGRATED CIRCUIT STRUCTURES HAVING IMPROVED COMPATIBILITY WITH VIA FILLER MATERIALS, AND METHOD OF MAKING SAME", was filed Oct. 22, 1999, and is assigned to the same assignee as this application. The subject matter of Ser. No. 09/426,061 is hereby incorporated by reference. In one embodiment in that application, low k silicon oxide dielectric material having a high carbon doping level is formed in the high aspect ratio regions between closely spaced apart metal lines and then a second layer comprising a low k silicon oxide dielectric material having a lower carbon content is then deposited over the first layer and the metal lines.

U.S. Pat. No. 6,391,795, issued May 21, 2002, entitled "LOW K DIELECTRIC COMPOSITE LAYER FOR INTEGRATED CIRCUIT STRUCTURE WHICH PROVIDES VOID-FREE LOW K DIELECTRIC MATERIAL BETWEEN METAL LINES WHILE MITIGATING VIA POISONING", was also filed on Oct. 22, 1999, and is assigned to the same assignee as this application. The subject matter of U.S. Pat. No. 6,391,795 is also hereby incorporated by reference. In one embodiment in that application, a void-free low k silicon oxide dielectric material is formed in the high aspect regions between closely spaced apart metal lines by one of several processes, including the process used to form the first low k silicon oxide dielectric material described in the previously cited Ser. No. 09/426,061 patent application. A second layer of low k silicon oxide dielectric material is then deposited over the first layer and the metal lines by a process which deposits at a rate higher than the deposition rate of the void-free dielectric material. In a preferred embodiment, both of the layers are formed in the same vacuum chamber without an intervening planarization step.

U.S. Pat. No. 6,423,628, issued Jul. 23, 2002, entitled INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES, was also filed on Oct. 22, 1999 and assigned to the assignee of this application. The subject matter of U.S. Pat. No. 6,423,628 is also hereby incorporated by reference. In that application the use of a silicon oxynitride capping layer over metal lines was suggested to provide an antireflective coating which could also function as a etch stop layer for a CMP planarizing process used to remove from over the metal lines portions of low k dielectric material used to fill the space between the metal lines. A second layer of standard k dielectric material was then formed over the silicon oxynitride capping layer and the low k dielectric material between the metal lines. Vias formed through the second dielectric layer and the silicon oxynitride capping layer down to the metal lines do not intersect the low k dielectric material and via poisoning is thereby prevented.

Thus, it is highly desirable to provide an integrated circuit structure having a low k dielectric layer, and a process for making same, wherein a dielectric layer is formed comprising low k silicon oxide dielectric material for high aspect ratio regions between closely spaced apart metal lines while mitigating the poisoning of vias subsequently formed in a dielectric layer down to the metal lines.

SUMMARY OF THE INVENTION

In accordance with the invention, a sacrificial chemical mechanical polishing layer of silicon nitride is formed over a metal layer on an oxide layer of an integrated circuit structure formed on a semiconductor substrate. Both the sacrificial polishing layer and the metal layer are then patterned to form horizontally closely spaced apart metal lines, each having a silicon nitride cap.

Low k silicon oxide dielectric material which exhibits void-free deposition properties in high aspect ratio regions between closely spaced apart metal lines is then deposited over and between the closely spaced apart metal lines and over the silicon nitride caps on the metal lines. After the formation of such low k silicon oxide dielectric material between the closely spaced apart metal lines and over silicon nitride caps thereon, a second layer of silicon nitride is deposited over the layer of low k silicon oxide dielectric material. This second silicon nitride layer acts a protective layer over portions of the layer of low k silicon oxide dielectric material between the metal lines which may be lower that the top surface of the silicon nitride caps on the metal lines to prevent further etching or dishing of those portions of the layer of low k silicon oxide dielectric material during the planarizing step.

The structure is then planarized by a process such as a CMP process to remove all low k dielectric material on the top surface of the silicon nitride caps over the metal lines and to bring the level of the low k material between the metal lines (and the second layer of silicon nitride thereon) down to the level of the tops of the silicon nitride caps on the metal lines. A second layer of standard k dielectric material is then formed over the planarized low k dielectric layer and the silicon nitride caps. Vias are then formed through the further dielectric layer and the silicon nitride caps down to the metal lines. Since the vias are not formed through the low k dielectric material, formation of the vias does not contribute to poisoning of the vias. However, the presence of the low k silicon oxide dielectric material between the horizontally closely spaced apart metal lines reduces the horizontal capacitance between such metal lines.

BRIEF DESCRIPTION OF THE DRAWINGS

FIG. 1 is a fragmentary vertical cross-sectional view of an integrated circuit structure with a composite layer comprising a metal line formed on an oxide layer of an integrated circuit structure and a silicon nitride capping layer formed over the composite layer, with a resist mask formed over the silicon nitride layer.

FIG. 2 is a fragmentary vertical cross-sectional view of the structure of FIG. 1 showing the silicon nitride layer etched through the resist mask.

FIG. 3 is a fragmentary vertical cross-sectional view of the structure of FIG. 2 with the composite layer etched through the resist mask and the silicon nitride mask to form over the oxide layer composite metal lines capped with silicon nitride.

FIG. 4 is a fragmentary vertical cross-sectional view of the structure of FIG. 3 showing a layer of low k silicon oxide dielectric material deposited over and between the composite metal lines after removal of the resist mask, and the formation of a second sacrificial layer formed over the low k dielectric layer to fill in dips in the upper surface of the low k dielectric layer and to protect those portions of the upper surface of the layer of low k silicon oxide dielectric material from dishing during the subsequent polishing step.

FIG. 5 is a fragmentary vertical cross-sectional view of the structure of FIG. 4 after planarization of the low k silicon oxide dielectric material down to the top of the silicon nitride caps on the composite metal lines.

FIG. 6 is a fragmentary vertical cross-sectional view of the structure of FIG. 5 after deposition of a layer of standard k dielectric material over the planarized low k silicon oxide dielectric material and the silicon nitride caps.

FIG. 7 is a fragmentary vertical cross-sectional view of the structure of FIG. 6 after formation of vias through the layer of standard k dielectric material and the silicon nitride caps down to the metal lines.

FIG. 8 is a flow sheet illustrating the process of the invention.

DETAILED DESCRIPTION OF THE INVENTION

The invention provides a structure and process wherein horizontal capacitance developed between closely spaced apart metal lines of an integrated circuit structure can be reduced without contributing to poisoning of vias subsequently formed down to such metal lines through dielectric material formed over the metal lines. In accordance with the invention, a sacrificial capping layer of dielectric material such as silicon nitride is formed over horizontally closely spaced apart metal lines on an oxide layer of an integrated circuit structure formed on a semiconductor substrate. Low k silicon oxide dielectric material, which exhibits void-free deposition properties in high aspect ratio regions between the closely spaced apart metal lines, is then deposited between the metal lines and over the silicon nitride caps on the metal lines.

After the formation of such low k silicon oxide dielectric material between the closely spaced apart metal lines and over silicon nitride caps thereon, a second layer of silicon nitride is deposited over the layer of low k silicon oxide dielectric material. This second silicon nitride layer acts as a protective layer over portions of the layer of low k silicon oxide dielectric material between the metal lines which may be lower than the top surface of the silicon nitride caps on the metal lines to prevent further etching or dishing of those portions of the layer of low k silicon oxide dielectric material during the planarizing step.

The structure is then planarized to bring the level of the low k dielectric material down to the level of the tops of the silicon nitride caps on the metal lines. A layer of standard dielectric material is then formed over the planarized void-free low k silicon oxide dielectric layer and the silicon nitride caps. Vias are then formed through the standard k dielectric layer and the silicon nitride caps down to the metal lines. Since the vias are not formed through the low k dielectric material, formation of the vias does not contribute to poisoning of the vias. However, the presence of the low k silicon oxide dielectric material between the horizontally closely spaced apart metal lines reduces the horizontal capacitance between such metal lines.

The term "low k", as used herein is intended to define a dielectric constant of 3.5 or less, preferably 3.0 or less, while the term "standard k", as used herein is intended to define a dielectric constant of over 3.5, typically about 4.0.

The term "high aspect ratio", as used herein to define the space between closely spaced apart metal lines, is intended to define a height to width ratio of at least 2, and usually about 3. The term "closely spaced apart metal lines", as used herein is therefore intended to define metal lines on the same level having a horizontal space between them which has a "high aspect ratio", as that term is defined above.

Turning now to FIG. 1, an integrated circuit structure 2 is shown with an oxide layer 6 such as a layer of silicon oxide conventionally formed over integrated circuit structure 2. Integrated circuit 2 includes semiconductor devices such as transistors formed in a semiconductor substrate, with contact openings (not shown) formed through oxide layer 6 from contacts on such devices. Structure 2 may further comprise lower layers of metal lines or interconnects formed therein with vias (not shown) formed through oxide layer 6 from such lower metal lines.

Formed over oxide layer 6 is shown a conventional electrically conductive composite layer 10 which typically may comprise a first layer 12 of a metal such as titanium to provide a conductive metal contact to underlying electrically conductive materials of the integrated circuit structure (such as metal-filled vias or contact openings), and a second layer 14 of a material such as titanium nitride which serves as a protective or barrier layer of electrically conductive material to isolate main electrically conductive metal layer 16 from interaction with underlying materials such as silicon or the titanium layer.

Typically main electrically conductive metal layer 16 will comprise a metal or metals such as aluminum or an aluminum/copper alloy. Top layer 18, also typically formed of titanium nitride in the illustrated embodiment, serves the same purpose as titanium nitride layer 14, i.e., to provide an electrically conductive layer which will metallurgically isolate main aluminum layer 16 from other materials in the integrated circuit structure.

It should be noted that while composite layer 10 is illustrated and described as a typical four layer composite layer, as is well known to those skilled in the art, other combinations of layers of metals and electrically conductive metal compounds could be used for the formation of electrically conductive composite layer 10. In fact, layer 10, while described herein as a "composite layer", may in fact comprise only a single metal layer. The use of the term "composite layer" should not, therefore, be construed as limited to the four illustrated electrically conductive layers. It should also be noted that the term "metal lines", as used herein for the composite layer after patterning to form lines, includes the presence of layers of electrically conductive metal compounds such as titanium nitride. Therefore, it will be understood that the term "metal lines", as used herein, is not limited to only metals, but includes electrically conductive metal compounds as well.

Silicon nitride layer 20 preferably ranges in thickness from about 50 nanometers (nm) to about 300 nm. to provide an adequate thickness for the CMP stop layer. Silicon nitride layer 20 may be formed over titanium nitride upper barrier layer 18 by PECVD using $SiH_4$ and $NH_3$ as the sources of silicon and nitrogen. The deposition may be carried out at an elevated temperature of about 400° C., and at a pressure of about 2–3 Torr.

As seen in FIG. 1, over silicon nitride layer 20 is formed a resist mask 30 which is patterned to form a series of metal lines or interconnects from underlying composite layer 10. As shown in FIG. 2, silicon nitride layer 20 may be first etched through the openings in resist mask 30 to reproduce the pattern of openings in silicon nitride layer 20. A plasma etcher using a $CHF_3$ and $O_2$ etch system may be used for this selective etching of silicon nitride layer 20. FIG. 2 shows the result of this etching step wherein the pattern in resist mask 30 has now been reproduced in silicon nitride layer 20, as shown at 20a–20d in FIG. 2.

This preliminary etching of silicon nitride layer 20, in turn, permits remaining silicon nitride portions 20a–20d to act as an etch mask for composite layer 10 which constitutes a further advantage for the use of silicon nitride layer 20 in the structure of the invention. The use of silicon nitride layer 20 as an etch mask means that resist mask 30 can be initially constructed thinner (e.g., about 4000 Å instead of about 6000 Å) than if only resist mask 30 were to be used for the etching of composite layer 10. The formation of a thinner resist mask 30, in turn, results in more accurate formation of resist mask 30.

After the etching of silicon nitride layer 20, the underlying layers 12, 14, 16, 18 comprising composite layer 10 may be etched through resist mask 30 and the openings between remaining portions 20a–20d of silicon nitride layer 20 (i.e., through the etch mask formed by the previous etching of layer 20) with the etch stopping at oxide layer 6. Any etch chemistry selective to silicon nitride, i.e. etch chemistry which will etch the individual layers of composite layer 10 in preference to silicon nitride may be used to etch composite layer 10, such as, for example, the $Cl_2$ and $BCl_3$ etch chemistry described in previously cited U.S. Pat. No. 6,423,628.

This etching of the four illustrated layers 12, 14, 16, and 18 comprising composite layer 10 forms electrically conductive composite lines which will herein after be referred to and illustrated as metal lines 10a–10d. Metal lines 10a–10d are capped by silicon nitride portions or caps 20a–20d, as shown in FIG. 3.

Resist layer 30 is then removed by a conventional ashing system, leaving on oxide layer 6 a system of metal lines, each capped with silicon nitride, as exemplified by the metal lines 10a–10d capped by silicon nitride caps 20a–20d shown in FIG. 3.

After formation of metal lines 10a–10d capped with silicon nitride caps 20a–20d, a protective or barrier layer 38 of conventional (standard k) dielectric material may be deposited over the entire structure to protect the subsequently deposited low k silicon oxide dielectric material to be described below from direct contact with the underlying metal lines. Barrier layer 38 may range in thickness from about 3 nm (the minimum amount for the desired protection) up to a maximum thickness of about 10 nm (beyond which the benefits of the low k dielectric material to be formed thereover could be negatively impacted).

A layer 40 of low k silicon oxide dielectric material is then deposited over barrier layer 38 in the regions between metal lines 10a–10d down to oxide layer 6, and over the tops of silicon nitride caps 20a–20d, as shown in FIG. 4. Low k silicon oxide dielectric layer 40 comprises any silicon oxide dielectric material having a dielectric constant of 3.5 or less, preferably 3.0 or less, and capable of forming void-free dielectric material in the regions between closely, spaced apart metal lines, i.e., in openings having a high aspect ratio of at least 2, usually at least 3.

Such void-free low k silicon oxide dielectric material may be deposited between metal lines 10–10d and over caps 20a–20d by reacting hydrogen peroxide with a carbon-substituted silane such as methyl silane, as described in the aforementioned article by L. Peters, and described in general for silane and peroxide reactions in Dobson U.S. Pat. No. 5,874,367, the subject matter of which is hereby incorporated by reference. The void-free low k silicon oxide dielectric material may also be deposited by reacting a mild oxidant such as hydrogen peroxide with the carbon-substituted silane materials disclosed in Aronowitz et al. U.S. Pat. No. 6,303,047, issued Oct. 16, 2001, and assigned to the assignee of this application, the subject matter of which is also hereby incorporated by reference. Other low k silicon oxide dielectric materials may also be used in the process of the invention, and the use of the above described low k silicon oxide dielectric material in the process of the invention should be considered to be by way of illustration and not by way of limitation.

Void-free low k silicon oxide dielectric layer 40 is deposited in sufficient quantity to substantially fill of the space between metal lines 10a–10d. While it is not required that low k dielectric layer 40 cover silicon nitride caps 20a–20d, the deposition of a sufficient amount of low k dielectric layer 40 to cover caps 20a–20d usually insures that the spaces between metal lines 10a–10d, i.e., the regions where it is desirable to suppress horizontal capacitance are substantially filled with the low k silicon oxide dielectric material. However, it has been found that the portions between metal lines 10a–10d are sometimes not completely filled with low k dielectric material. Therefore, as shown in FIG. 4, in accordance with one aspect of the invention, a protective layer 44 is formed over low k layer 40. Layer 44 preferably also comprise silicon nitride. Layer 44 serves a dual purpose. First of all, as the polishing step begins to reach the level of the silicon nitride caps 20a–20d on the metal lines, silicon nitride layer 44 serves to protect the exposed upper surface of low k dielectric layer 40 between the metal lines to prevent the polishing step from further forming dished in or concave in the upper surface of low k dielectric layer 40, since the low k dielectric layer tends to polish faster than the silicon nitride caps on the metal lines. Layer 44 also serves to provide a more planar surface after the polishing step, i.e., a surface without dimples or valleys where the low k material did not completely fill the space between the lines.

After deposition of layer 40 of low k silicon oxide dielectric material, and protective layer 44, the structure may be subject to a anneal or heat-treatment prior to planarization, such as by chemical mechanical polishing (CMP). The structure may be removed from the deposition reactor and heat treated at a temperature of between about 300° C. to about 500° C., typically from about 400° C. to about 450° C. for about 2–5 minutes, i.e., subject to a rapid thermal anneal (RTA). Conventional annealing, i.e., baking at the same temperature for up to 60 minutes, may also be used, but is not preferred due to the adverse effect on the thermal budget of the structure.

The annealed structure is then moved to a planarization chamber or apparatus where all of the low k dielectric material on the upper surface of silicon nitride caps 20a–20d is removed, leaving only low k silicon oxide dielectric material 40a–40c with remaining portions of layer 44 thereon in the respective regions between metal lines 10a–10d, as shown in FIG. 5. Such excess low k dielectric material over silicon nitride caps 20a–20d can be removed by a chemical mechanical polishing (CMP) process, using, for example, a KOH-based oxide CMP slurry which is selective to silicon nitride, i.e., will etch the low k silicon oxide dielectric material of layer 40 in preference to silicon nitride. The low k silicon oxide dielectric material is then removed by the CMP process until the top surface of the silicon nitride caps 20a–20d is exposed which then functions as an etch stop. This constitutes yet a further function of silicon nitride caps 20a–20d.

After planarization of the structure by removal of the excess low k dielectric material, the structure is moved to a deposition apparatus where a further layer 50 of conventional (standard k) silicon oxide dielectric material is deposited over the planarized low k silicon oxide dielectric material of layer 40 and over the tops of silicon nitride caps 20a–20d, as shown in FIG. 6. In accordance with a preferred embodiment of the invention standard k silicon oxide dielectric material is deposited over planarized low k dielectric layer 40 by any conventional deposition process including, by way of example only, TEOS (tetraethyl orthosilicate) and $O_2/O_3$, fluorinated silicon glass (FSG) using high density plasma (HDP), and plasma enhanced chemical vapor deposition (PECVD) using silane and $O_2$. The thickness of layer 50 will depend upon the desired overall thickness of dielectric material separating metal lines 10a–10d from the next layer of integrated circuit material such as another layer of metal lines. Typically the thickness of standard k silicon oxide dielectric layer 50 deposited over the structure will range from about 300 nm to about 700 nm. It will be noted that the upper surface of oxide layer 50 is planar due to the conformal nature of the deposition and the underlying planar surface formed by silicon nitride caps 20a–20d, low k dielectric material 40a–40c in the space between the metal lines and the remaining portions of layer 44.

After formation of standard k silicon oxide layer 50, an optional further planarization step may be carried out if the process chosen for deposition of dielectric layer 50 doe not result in a planarized top surface on layer 50. A via resist mask (not shown) may then be formed over silicon oxide dielectric layer 50 and vias 60 may then be cut through dielectric layer 50 and underlying silicon nitride caps 20a–20d to the tops of metal lines 10a–10d, as shown in FIG. 7. Vias 60 are etched using, for example, a $CF_4$ and $CHF_3$ plasma etch system to etch oxide layer 50 down to the top surface of silicon nitride caps 20a–20d. The etchant is then changed to a $CHF_3$ and $O_2$ etchant system to etch through the exposed portions of silicon nitride caps 20a–20d down to metal lines 10a–10d. Vias 60 may then be filled with appropriate electrically conductive filler material, e.g., a titanium nitride liner and a tungsten filler material, as is well known to those skilled in the art.

The resultant structure, as shown in FIG. 7, is formed with low k silicon oxide dielectric material occupying substantially the entire region between the metal lines, with the second protective layer formed over the layer of low k material serving to inhibit any further dishing of the surface of the low k layer during the polishing step, so that horizontal capacitance between the closely spaced apart metal lines is suppressed or reduced. Furthermore, due to the presence of the silicon nitride cap material on the upper surfaces of the metal lines, functioning as a buffer or barrier material between sidewalls of the vias and the low k silicon oxide dielectric material, the low k silicon oxide dielectric material can be deposited in the regions between closely spaced apart metal lines up to the very top of the metal lines without surfaces of such low k silicon oxide dielectric material becoming subsequently exposed by formation of the vias down to the metal lines. Via poisoning due to exposure of portions of the low k silicon oxide dielectric material during via formation is thereby suppressed or eliminated, because the sidewalls of the vias only cut through the layer of standard k silicon oxide material and the silicon nitride buffer material, i.e., the vias do not pass through the low k silicon oxide dielectric material.

The following will serve to further illustrate the invention.

A 90 nm silicon nitride layer may be deposited over an electrically conductive composite layer previously formed over an oxide layer on an eight inch diameter silicon substrate by plasma enhanced chemical vapor deposition (PECVD), using $SiH_4$ and $NH_3$ gases. The underlying composite layer can consist of a titanium metal bottom layer, a lower titanium nitride barrier layer over the titanium layer, a main aluminum/copper alloy layer, and a top titanium nitride barrier layer. A resist mask, patterned to form a series of metal lines or interconnects, is then formed over the silicon nitride layer. The silicon nitride layer is then etched through the resist mask using a $CHF_3$ and $O_2$ etch system to expose the underlying titanium nitride top barrier layer, i.e., the uppermost layer of the electrically conductive composite layer.

The titanium nitride layer is then etched through to the aluminum/copper alloy layer, using etch chemistry selective to silicon nitride to thereby permit the previously etched silicon nitride layer to function as a mask to form the metal lines. The aluminum/copper alloy layer, the lower titanium nitride barrier layer, and the titanium metal layer are then etched to form the silicon nitride-capped metal lines, with the etch stopping when the underlying oxide layer is reached. The result will be a pattern of silicon nitride-capped metal lines having a horizontal spacing there between of about 200 nm, and a height of about 500 nm, resulting in regions between the closely spaced apart metal lines having an aspect ratio of about 2.5.

After the etching of the composite layer is completed to form the pattern of silicon nitride-capped metal lines or interconnects, the resist mask can be removed with a conventional ashing process, i.e., using $O_2$ with a plasma.

A layer of low k silicon oxide dielectric material can then be deposited in the regions between the closely spaced apart metal lines by flowing carbon-doped silane and hydrogen peroxide into the deposition chamber, while the chamber is maintained at a temperature of 0° C. until the deposition of low k silicon oxide dielectric material reaches the top of the silicon nitride caps on the metal lines. The structure is then heat treated for 3 minutes at a temperature of between about 400–450° C., following which a second protective layer of silicon nitride is deposited over the low k layer.

The annealed structure is then moved to a CMP chamber or apparatus where all of the low k dielectric material on the upper surface of the silicon nitride caps is removed, using a KOH-based oxide CMP slurry selective to silicon nitride, until the top surface of the silicon nitride caps is exposed, i.e., the silicon nitride caps function as an etch stop. This leaves the low k silicon oxide dielectric material (with remaining portions of the second protective layer of silicon nitride thereon) only in the respective regions between the metal lines. A 500 nm layer of standard k silicon oxide dielectric material is then deposited over the structure using PECVD.

After formation of the standard k silicon oxide dielectric layer over the protective silicon nitride layer on the low k silicon oxide dielectric layer, and over the exposed silicon nitride caps over the metal lines, the substrate is removed from the reactor. A via resist mask is then applied to the upper surface of the PECVD oxide layer. Vias are cut through the PECVD standard k silicon oxide layer, using $CF_4$, and $O_2$, stopping at the silicon nitride cap on the metal line. The etchant system is then changed to a $CHF_3$ and $O_2$ etch system to etch silicon nitride selective to titanium nitride until the bottom of the vias reaches the titanium nitride top barrier layer of the metal lines.

The vias can then be filled by first sputtering a protective coating of titanium nitride over the surfaces of the vias and then filling the vias with tungsten. When the substrate is then examined in cross-section by scanning electron microscopy (SEM) to determine how many of the vias were filled with tungsten, it will be found that substantially all of the vias will be filled with tungsten, indicating an absence of via poisoning.

Thus the invention provides a process wherein low k silicon oxide dielectric material occupies substantially the entire region between closely spaced apart metal lines so that horizontal capacitance between the closely spaced apart metal lines is suppressed or reduced, while at the same time, via poisoning can also be suppressed or eliminated due to the presence of the silicon nitride cap material on the upper surfaces of the metal lines and the formation of standard k silicon oxide dielectric material above the silicon nitride caps.

This silicon nitride cap layer on the metal lines functions as a buffer material between the sidewalls of the vias and the low k silicon oxide dielectric material. Thus, the low k silicon oxide dielectric material can be deposited in the regions between closely spaced apart metal lines up to the very top of the metal lines without surfaces of such low k silicon oxide dielectric material becoming subsequently exposed by formation of the vias down to the metal lines. Since the vias do not pass through the low k silicon oxide dielectric material, via poisoning due to exposure of portions of the low k silicon oxide dielectric material during via formation is thereby suppressed or eliminated, because the sidewalls of the vias only cut through the layer of standard k silicon oxide dielectric material and the silicon nitride buffer material. Furthermore, the second protective layer of silicon nitride protects the underlying surface of the low k dielectric material between the metal lines to inhibit further polishing of such low k dielectric material to form dished out portions. Prevention of formation of such dished out portions in the surfaces of the low k dielectric material ensures that substantially all of the space between the metal lines will be occupied by low k dielectric material to thereby reduce horizontal capacitance between the metal lines.

Having thus described the invention what is claimed is:

1. A process for forming an integrated circuit structure on a semiconductor substrate and characterized by reduced horizontal capacitance between closely spaced apart metal lines which comprises:
    a) forming, on an oxide layer of an integrated circuit structure on a semiconductor substrate, closely spaced apart metal lines with silicon nitride caps thereon;
    b) depositing low k silicon oxide dielectric material between said closely spaced apart metal lines and over said silicon nitride caps on said metal lines;
    c) forming a second layer of silicon nitride over said low k silicon oxide dielectric material;
    d) then planarizing said low k silicon oxide dielectric material down to the level of a top surface of said silicon nitride caps; and
    e) depositing a layer of standard k silicon oxide over said planarized low k silicon oxide dielectric and said silicon nitride caps.

2. The process of claim 1 wherein said step of forming closely spaced apart metal lines with silicon nitride caps on an oxide layer comprises the further steps of:
    a) forming a composite layer of electrically conductive material on an oxide layer of an integrated circuit structure on a semiconductor substrate;
    b) forming a silicon nitride layer over said composite layer;
    c) patterning said silicon nitride layer; and
    d) patterning said composite layer through said patterned silicon nitride layer to form said closely spaced apart metal lines capped with silicon nitride on said oxide layer.

3. The process of claim 2 wherein said step of forming a silicon nitride layer over said composite layer further comprises forming from about 300 Å to about 1200 Å of silicon nitride over said composite layer.

4. The process of claim 3 including the further step of forming vias through said layer of standard k silicon oxide and said silicon nitride caps down to said closely spaced apart metal lines.

5. A process for forming an integrated circuit structure on a semiconductor substrate and characterized by reduced horizontal capacitance between closely spaced apart metal lines which comprises:
    a) forming a composite layer of electrically conductive material on an oxide layer of an integrated circuit structure on a semiconductor substrate;
    b) forming a silicon nitride layer over said composite layer;
    c) patterning said silicon nitride layer;
    d) patterning said composite layer through said patterned silicon nitride layer to form on said oxide layer closely spaced apart metal lines capped with silicon nitride;
    e) depositing low k silicon oxide dielectric material between said closely spaced apart metal lines and over said silicon nitride caps on said metal lines;
    f) depositing a second silicon nitride layer over said low k silicon oxide dielectric material to fill in any low regions in the surface of said low k silicon oxide dielectric material;
    g) planarizing said low k silicon oxide dielectric material down to the level of a top surface of said silicon nitride caps;
    h) depositing a layer of standard k silicon oxide over said planarized low k silicon oxide dielectric and said silicon nitride caps; and
    i) forming vias through said layer of standard k silicon oxide and said silicon nitride caps down to said closely spaced apart metal lines.

6. The process of claim 5 wherein said step of forming a silicon nitride layer over said composite layer further comprises forming from about 300 Å to about 1200 Å of silicon nitride over said composite layer.

7. The process of claim 6 wherein said step of forming a composite layer of electrically conductive material on an oxide layer of an integrated circuit structure on a semiconductor substrate comprises the further steps of:
    a) forming over said oxide layer a first layer of metal capable of providing a conductive metal contact to underlying electrically conductive materials of said integrated circuit structure;
    b) forming a first barrier layer of electrically conductive material over said first layer of metal;
    c) forming a main metal layer on said first barrier layer; and
    d) forming a second barrier layer of electrically conductive material on said main metal layer.

8. The process of claim 7 wherein said step of forming over said oxide layer a first layer of metal capable of providing a conductive metal contact to underlying electrically conductive materials of said integrated circuit structure further comprises forming a layer of titanium over said oxide layer.

9. The process of claim 6 wherein said step of depositing low k silicon oxide dielectric material between said closely spaced apart metal lines and over said silicon nitride caps on said metal lines further comprises reacting carbon-substituted silicon with a mild oxidant to form said low k silicon oxide dielectric material.

10. The process of claim 6 wherein said step of depositing low k silicon oxide dielectric material between said closely spaced apart metal lines and over said silicon nitride caps on said metal lines further comprises reacting carbon-substituted silane with hydrogen peroxide to form said low k silicon oxide dielectric material.

11. The process of claim 10 wherein said carbon-substituted silane comprises a carbon-substituted silane having only primary hydrogens bonded to the carbon atoms and having the formula: $SiH_x((C)_y(CH_3)_z)_{(4-x)}$, where x ranges from 1 to 3, y is an integer from 1 to 4 for a branched alkyl group and from 3 to 5 for a cyclic alkyl group, and z is 2y+1 for a branched alkyl group and 2y−1 for a cyclic alkyl group.

12. The process of claim 6 wherein said step of planarizing said low k silicon oxide dielectric material down to the level of a top surface of said silicon nitride caps further comprises chemically/mechanically polishing said low k silicon oxide dielectric material.

13. The process of claim 5 wherein said step of forming a composite layer of electrically conductive material on an oxide layer of an integrated circuit structure on a semiconductor substrate comprises the further steps of:
- a) forming a first barrier layer of electrically conductive material over said oxide layer;
- b) forming a main metal layer on said first barrier layer; and
- c) forming a second barrier layer of electrically conductive material on said main metal layer.

14. The process of claim 13 wherein said step of forming a main metal layer comprises forming a main metal layer from aluminum or an alloy of aluminum and copper.

15. The process of claim 13 wherein said first and second barrier layers of electrically conductive material comprise titanium nitride.

16. A process for forming an integrated circuit structure on a semiconductor substrate and characterized by reduced horizontal capacitance between closely spaced apart metal lines thereon without poisoning of vias formed through dielectric material to such metal lines which process comprises:
- a) forming, on an oxide layer of an integrated circuit structure on a semiconductor substrate, a composite layer of electrically conductive material by the steps of:
  - i) forming a first barrier layer of electrically conductive material over said oxide layer;
  - ii) forming a main metal layer on said first barrier layer; and
  - iii) forming a second barrier layer of electrically conductive material on said main metal layer;
- b) forming over said composite layer a silicon nitride layer ranging in thickness from about 300 Å to about 1200 Å;
- c) patterning said silicon nitride layer;
- d) patterning said composite layer through said patterned silicon nitride layer to form, on said oxide layer, closely spaced apart metal lines capped with silicon nitride;
- e) depositing between said closely spaced apart metal lines and over said silicon nitride caps on said metal lines low k silicon oxide dielectric material formed by reacting carbon-substituted silane with hydrogen peroxide;
- f) depositing over said low k silicon oxide dielectric material a second silicon nitride layer to fill in any low regions in the surface of said low k silicon oxide dielectric material;
- g) planarizing said low k silicon oxide dielectric material down to the level of a top surface of said silicon nitride caps by chemically/mechanically polishing said low k silicon oxide dielectric material;
- h) depositing a layer of standard k silicon oxide dielectric material over said planarized low k silicon oxide dielectric material and said silicon nitride caps; and
- i) forming vias through said layer of standard k silicon oxide dielectric material and said silicon nitride caps down to said metal lines without contacting said low k silicon oxide dielectric material, whereby poisoning of said vias by said process is avoided.

17. A process for forming an integrated circuit structure on a semiconductor substrate and characterized by reduced horizontal capacitance between closely spaced apart metal lines which comprises:
- a) forming, on an oxide layer of an integrated circuit structure on a semiconductor substrate, closely spaced apart metal lines with silicon nitride caps thereon;
- b) depositing low k silicon oxide dielectric material between said closely spaced apart metal lines and over said silicon nitride caps on said metal lines;
- c) forming, (over said low k silicon oxide dielectric material between said closely spaced apart metal lines and over said silicon nitride caps on said metal lines), a layer of a protective material capable of inhibiting dishing of said low k silicon oxide dielectric material during a subsequent planarizing step;
- d) planarizing said low k silicon oxide dielectric material down to the level of a top surface of said silicon nitride caps; and
- e) depositing a layer of standard k silicon oxide over said planarized low k silicon oxide dielectric and said silicon nitride caps.

* * * * *